US007535035B2

(12) United States Patent
Baek et al.

(10) Patent No.: US 7,535,035 B2
(45) Date of Patent: May 19, 2009

(54) CROSS-POINT NONVOLATILE MEMORY DEVICES USING BINARY METAL OXIDE LAYER AS DATA STORAGE MATERIAL LAYER AND METHODS OF FABRICATING THE SAME

(75) Inventors: In-Gyu Baek, Seoul (KR); Moon-Sook Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/241,604

(22) Filed: Sep. 30, 2005

(65) Prior Publication Data
US 2006/0097288 A1    May 11, 2006

(30) Foreign Application Priority Data
Nov. 10, 2004   (KR) ............... 10-2004-0091554

(51) Int. Cl.
*H01L 29/73* (2006.01)
*H01L 21/82* (2006.01)
(52) U.S. Cl. ............... 257/208; 257/211; 257/E27.033; 257/E21.662; 438/128; 438/129
(58) Field of Classification Search ............... 257/208, 257/209, 211, E27.033, E21.662; 438/128, 438/129, 257, 266
See application file for complete search history.

(56) References Cited

U.S. PATENT DOCUMENTS

| 3,721,838 | A | 3/1973 | Brickman et al. | |
|---|---|---|---|---|
| 6,599,796 | B2 | 7/2003 | Mei et al. | |
| 6,746,910 | B2 | 6/2004 | Hsu et al. | |
| 6,905,937 | B2 * | 6/2005 | Hsu et al. | 438/385 |
| 7,042,035 | B2 * | 5/2006 | Rinerson et al. | 257/295 |
| 2002/0024092 | A1 | 2/2002 | Palm et al. | |
| 2004/0108528 | A1 | 6/2004 | Hsu et al. | |
| 2004/0168145 | A1 | 8/2004 | Forbes | |

(Continued)

FOREIGN PATENT DOCUMENTS

EP    1 150 350 A2    10/2001

(Continued)

OTHER PUBLICATIONS

Combined Search and Examination Report under Sections 17 and 18(3), GB Application No. GB0522685.7, Mar. 31, 2006.

(Continued)

*Primary Examiner*—Tuan N. Quach
(74) *Attorney, Agent, or Firm*—Myers Bigel Sibley & Sajovec, P.A.

(57) ABSTRACT

A cross-point nonvolatile memory device using a binary metal oxide layer as a data storage material layer includes spaced apart doped lines disposed in a substrate. Spaced apart upper electrodes cross over the doped lines such that cross points are formed where the upper electrodes overlap the doped lines. Lower electrodes are disposed at the cross points between the doped lines and the upper electrodes. A binary metal oxide layer is provided between the upper electrodes and the lower electrodes and provided as a data storage material layer. Doped regions are provided between the lower electrodes and the doped lines and form diodes together with the doped lines. The doped regions have an opposite polarity to the doped lines.

19 Claims, 6 Drawing Sheets

U.S. PATENT DOCUMENTS

2005/0054138 A1* 3/2005 Hsu et al. .................... 438/59
2006/0250836 A1* 11/2006 Herner et al. ............... 365/148
2006/0273298 A1* 12/2006 Petti ............................ 257/5

FOREIGN PATENT DOCUMENTS

| EP | 1 484 799 A2 | 12/2004 |
| EP | 1 544 899 A2 | 6/2005 |
| KR | 10-2004-0005425 A | 1/2004 |
| KR | 10-2004-0028498 A | 4/2004 |
| WO | WO0049659 * | 8/2000 |
| WO | WO 03/079463 A3 | 9/2003 |
| WO | WO 2005/024839 A1 | 3/2005 |

OTHER PUBLICATIONS

Nature Materials/Insight, vol. 6, No. 11 (full issue), Nov. 2007.
Notification of First Office Action, Chinese Application No. 200510120457.7, Dec. 21, 2007.
Notification of the Second Ofice Action with English-language translation, Chinese Patent Application No. 200510120457.7, Mar. 6, 2009.

* cited by examiner

CROSS-POINT NONVOLATILE MEMORY DEVICES USING BINARY METAL OXIDE LAYER AS DATA STORAGE MATERIAL LAYER AND METHODS OF FABRICATING THE SAME

CROSS-REFERENCE TO RELATED APPLICATION

This application claims the benefit under 35 USC § 119 of Korean Patent Application No. 10-2004-0091554 filed on Nov. 10, 2004, the disclosure of which is hereby incorporated herein by reference in its entirety as if set forth fully herein.

FIELD OF THE INVENTION

The present invention relates to nonvolatile memory devices and methods of fabricating the same and, more particularly, to cross-point nonvolatile memory devices and methods of fabricating the same.

BACKGROUND OF THE INVENTION

Nonvolatile memory devices do not lose data stored therein even if power is interrupted. Thus, nonvolatile memory devices are being widely employed in computers, mobile communication terminals, memory cards, and the like.

A flash memory device is commonly used as a nonvolatile memory device. In general, the flash memory device includes memory cells, each of which has a stacked gate structure. The stacked gate structure may include a tunnel oxide layer, a floating gate, an inter-gate dielectric layer, and a control gate electrode, which are sequentially stacked on a channel region.

Recently, new nonvolatile memory devices, such as a resistance random access memory (resistance RAM), have been proposed. A unit cell of the resistance RAM includes a data storage element which has two electrodes and a variable resistive material layer interposed between the two electrodes. The variable resistive material layer, i.e., a data storage material layer, has a reversible variation in resistance according to the polarity and/or magnitude of an electric signal (voltage or current) applied between the electrodes.

A cross-point resistance RAM is disclosed by Hsu et al. in U.S. Patent Publication No. US2004/0108528 entitled "Cross-Point Resistor Memory Array and Method of Fabrication." According to this disclosure, a colossal magnetoresistive (CMR) material layer or high-temperature superconducting (HTSC) material layer is employed as a data storage material layer. Examples of the CMR or HTSC material layer are a PrCaMnO$_3$ (PCMO) layer and a GdCaBaCO$_2$O$_{5+\delta}$ layer. However, in order to form the material layers, at least four kinds of materials may need to be mixed, and the crystalline structure of the resultant material layer may be highly dependent on an underlying layer. Accordingly, the composition ratio of the material layer may be non-uniform across the device. Also, it may be difficult to pattern the PCMO layer or the HTSC material layer using typical photolithography and etching processes, which are widely used in the fabrication of semiconductor devices. Further, according to U.S. Patent Publication No. US2004/0108528, a noble metal layer such as platinum (Pt), iridium (Ir), or ruthenium (Ru) is deposited and polished using a chemical mechanical polishing (CMP) process, thereby forming a lower electrode. However, since the above-described noble metals are chemically very stable, they may be difficult to polish by the CMP process to form the lower electrode.

SUMMARY OF THE INVENTION

Nonvolatile memory devices according to exemplary embodiments of the present invention include a plurality of first spaced apart lines and a plurality of second spaced apart lines that cross over the plurality of first spaced apart lines to define a plurality of cross-points therebetween. A diode and a binary metal oxide nonvolatile data storage medium are serially connected between the first and second spaced apart lines at the respective cross-points. In some embodiments, the spaced apart lines comprise a plurality of doped regions of a first conductivity type in a substrate and the diode comprises a doped region of a second conductivity type on the doped regions of the first conductivity type. In some embodiments, an electrode may be connected between the diode and the binary metal oxide.

Other embodiments of the invention are directed to cross-point nonvolatile memory devices using a binary metal oxide layer as a data storage material layer. These nonvolatile memory devices can include a plurality of spaced apart doped lines disposed in a substrate. A plurality of spaced apart upper electrodes cross over the doped lines such that cross points are formed where the upper electrodes overlap the doped lines. A plurality of lower electrodes are provided, a respective one of which is disposed at a respective cross point between the doped lines and the upper electrodes. A binary metal oxide data storage material layer is provided between the upper electrodes and the lower electrodes. Doped regions are provided between the lower electrodes and the doped lines and form diodes together with the doped lines. The doped regions have an opposite conductivity to the doped lines.

In some embodiments, the binary metal oxide layer may be expressed as a chemical formula of M$_x$O$_y$. Herein, the characters "M", "O", "x", and "y" refer to a metal, oxygen, a metal composition ratio, and an oxygen composition ratio, respectively, and the metal "M" may be a transition metal and/or aluminum (Al). The transition metal may be nickel (Ni), niobium (Nb), titanium (Ti), zirconium (Zr), hafnium (Hf), cobalt (Co), iron (Fe), copper (Cu), and/or chrome (Cr). Specific examples of binary metal oxides that may be used as a data storage material layer include CuO, NiO, CoO, ZnO, CrO$_2$, TiO$_2$, HfO$_2$, ZrO$_2$, Fe$_2$O$_3$, and Nb$_2$O$_5$.

In other embodiments, the doped regions may be doped layer patterns disposed at the cross points on the doped lines, respectively. In this case, the doped layer patterns may be doped polysilicon layer patterns and/or doped single crystalline silicon layer patterns.

In still other embodiments, the doped lines may be N-type lines, and the doped layer patterns may be P-type patterns.

In yet other embodiments, the lower electrodes and the upper electrodes may comprise an iridium layer, a platinum layer, a ruthenium layer, an iridium oxide layer, a ruthenium oxide layer, a tungsten layer, a titanium nitride layer, and/or a polysilicon layer.

In still other embodiments, the nonvolatile memory device may further include an insulating layer in spaces between the binary metal oxide layer and the substrate. The insulating layer may be a silicon oxide layer, a silicon nitride layer, and/or a silicon oxynitride layer.

Other embodiments of the invention provide methods of fabricating a nonvolatile memory device using a binary metal oxide layer as a data storage material layer. These methods include forming a plurality of spaced apart doped lines in a substrate. A plurality of doped regions are formed on the doped lines, and a plurality of lower electrodes are formed on the doped regions. Here, the doped regions are in contact with the doped lines and have an opposite conductivity to the doped lines. A binary metal oxide layer is formed on the lower electrodes. A plurality of spaced apart upper electrodes are formed on the binary metal oxide layer such that the upper electrodes overlap the lower electrodes and intersect the doped lines.

In some embodiments, the formation of the doped lines may include forming mask patterns having line-shaped openings on the substrate; and implanting impurity ions into the substrate using the mask patterns as ion implantation masks.

In other embodiments, the formation of the doped regions and the lower electrodes may include forming a doped layer having an opposite conductivity to the doped lines on the substrate having the doped lines; forming a lower conductive layer on the doped layer; and sequentially patterning the lower conductive layer and the doped layer.

In still other embodiments, when the doped lines are formed of N-type impurity ions, the doped layer may be formed of P-type impurity ions.

In yet other embodiments, the doped layer may be a doped polysilicon layer and/or a doped single crystalline silicon layer.

In yet other embodiments, the lower electrodes and the upper electrodes may comprise an iridium layer, a platinum layer, a ruthenium layer, an iridium oxide layer, a ruthenium oxide layer, a tungsten layer, a titanium nitride layer, and/or a polysilicon layer.

In still other embodiments, before forming the binary metal oxide layer, an insulating layer may be formed on the substrate to cover the doped regions and the lower electrodes and planarized to expose the lower electrodes. In this case, the binary metal oxide layer may be formed on the lower electrodes and on the planarized insulating layer.

In yet other embodiments, the binary metal oxide layer may be expressed as a chemical formula of $M_xO_y$. Herein, the characters "M", "O", "x", and "y" refer to a metal, oxygen, a metal composition ratio, and an oxygen composition ratio, respectively, and the metal "M" may be a transition metal or aluminum. The transition metal may be nickel, niobium, titanium, zirconium, hafnium, cobalt, iron, copper, or chrome. Specific examples may be provided as noted above.

DETAILED DESCRIPTION

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Moreover, each embodiment described and illustrated herein includes its complementary conductivity type embodiment as well. Like numbers refer to like elements throughout.

It will be understood that when an element is referred to as being "connected", "responsive" or "in response to" another element, it can be directly connected, responsive or in response to the other element or intervening elements may be present. In contrast, the term "directly" means there are no intervening elements present. As used herein, the term "and/or" includes any and all combinations of one or more of the associated listed items and may be abbreviated as "/".

It also will be understood that, as used herein, the terms "row" or "horizontal" and "column" or "vertical" indicate two relative non-parallel directions that may be orthogonal to one another. However, these terms do not require an absolute horizontal or vertical orientation as shown in the figures.

It will be understood that, although the terms first, second, etc. may be used herein to describe various elements, these elements should not be limited by these terms. These terms are only used to distinguish one element from another. For example, a first line could be termed a second line, and, similarly, a second line could be termed a first line without departing from the teachings of the disclosure.

Spatially relative terms, such as "beneath", "below", "lower", "above", "upper" and the like, may be used herein for ease of description to describe an element and/or a feature's relationship to another element(s) and/or feature(s) as illustrated in the figures. It will be understood that the spatially relative terms are intended to encompass different orientations of the device in use or operation in addition to the orientation depicted in the figures. For example, if the device in the figures is turned over, elements described as "below" and/or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 1:
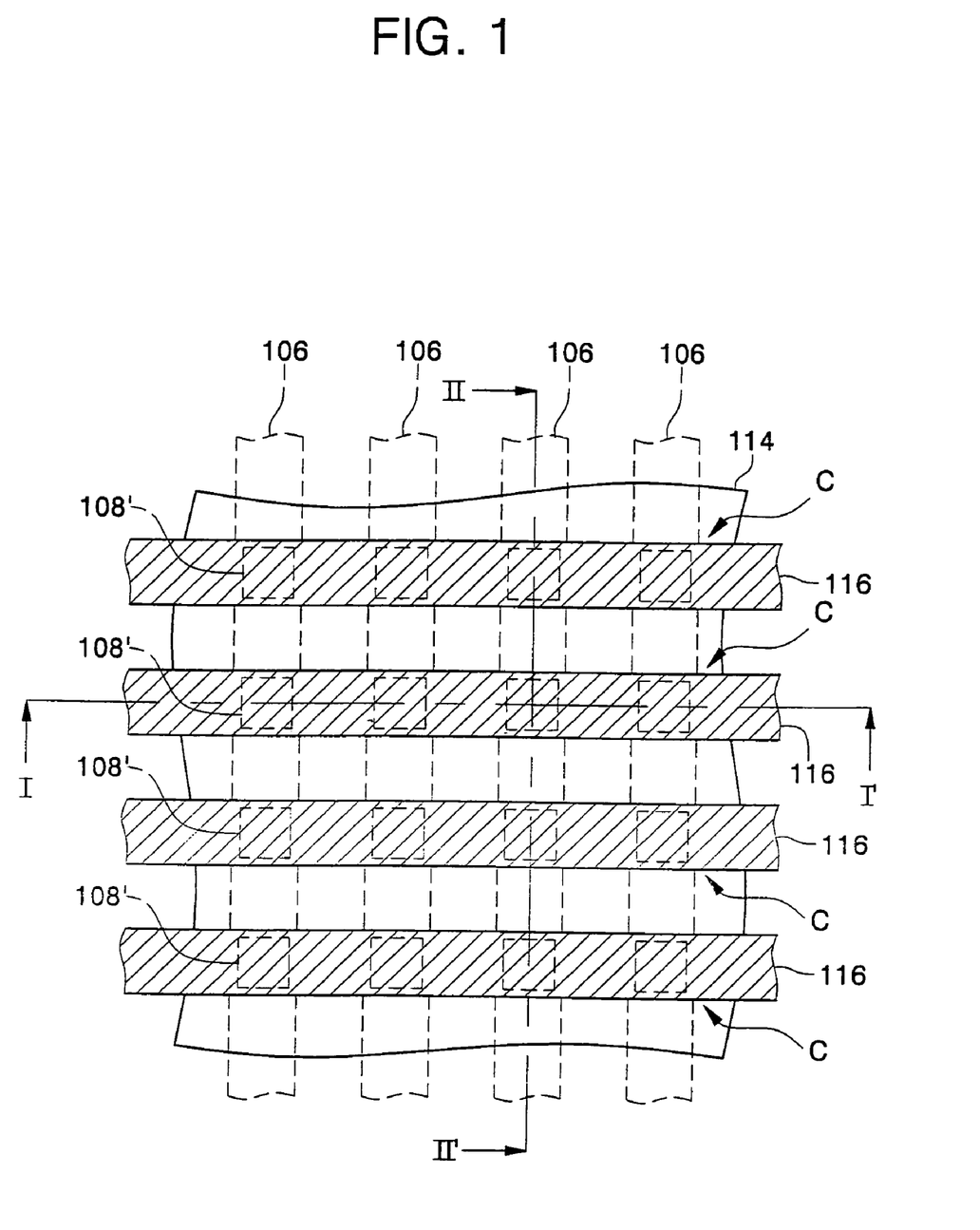
FIG. 1 is a plan view of a resistance RAM device according to embodiments of the present invention.

FIG. 1 is a plan view of a resistance RAM device according to exemplary embodiments of the present invention, and FIGS. 2A, 2B, 3A, 3B, 4A, 4B, 5A, 5B, 6A, and 6B are cross-sectional views illustrating methods of fabricating a resistance RAM device, and a device formed thereby, according to exemplary embodiments of the present invention. In detail, FIGS. 2A, 3A, 4A, 5A, and 6A are cross-sectional views taken along the line I-I' of FIG. 1, and FIGS. 2B, 3B, 4B, 5B, and 6B are cross-sectional views taken along the line II-II' of FIG. 1.

Figure 6A:
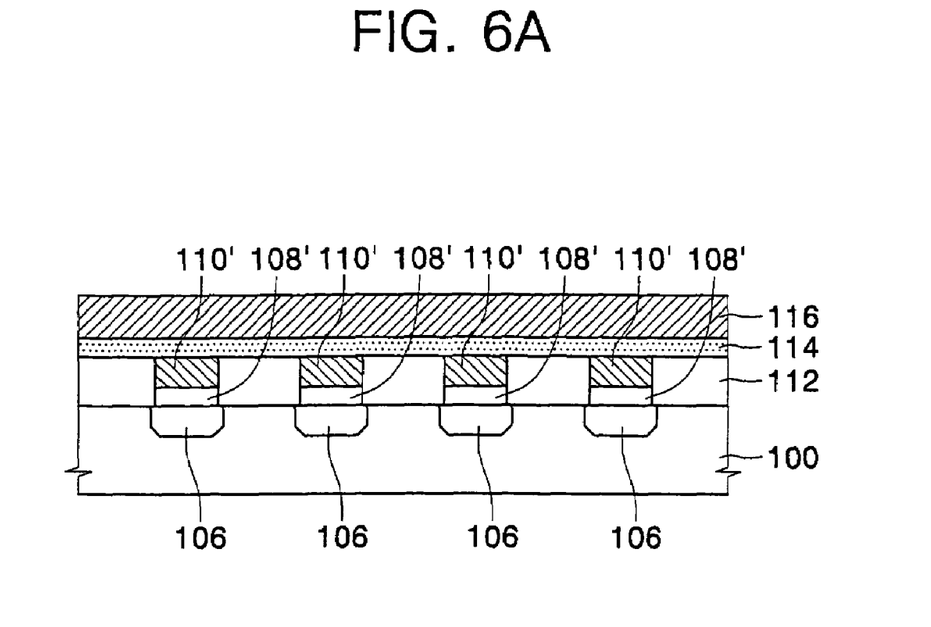
Figure 6B:
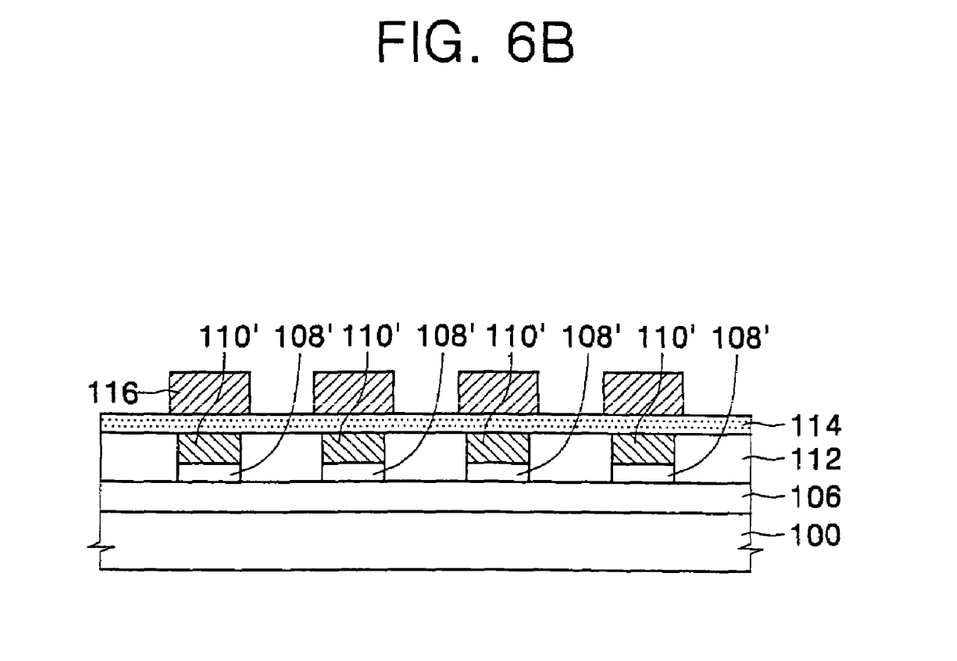

Referring to FIGS. 1, 6A, and 6B, a plurality of spaced apart, and in some embodiments, parallel, doped lines 106 are disposed in a substrate, such as a semiconductor substrate 100. The doped lines 106 may be diffused layers formed of N-type impurity ions, such as arsenic (As) ions or phosphorus (P) ions. The doped lines 106 may be provided as bit lines of the resistance RAM device. A plurality of spaced apart, and in some embodiments, parallel, upper electrodes 116 are disposed to cross over the doped lines 106. The upper electrodes 116 are spaced a predetermined distance apart from each other on the surface of the semiconductor substrate 100 in which the doped lines 106 are formed. The upper electrodes 116 cross over the doped lines 106 such that cross points "C" can be formed in respective regions where the upper electrodes 116 overlap the doped lines 106. The upper electrodes 116 may be provided as word lines of the resistance RAM device. In some embodiments of the present invention, the upper electrodes 116 may make an angle of 90° with the doped lines 106, respectively, when viewed from the plan view. The upper electrodes 116 may be formed of a noble metal layer, a noble metal oxide layer, a tungsten layer, a titanium nitride layer and/or a polysilicon layer. In this case, the noble metal layer may be an iridium layer, a platinum layer and/or a ruthenium layer. Also, the noble metal oxide layer may be an iridium oxide layer and/or a ruthenium oxide layer.

Doped regions 108' with an opposite conductivity to the doped lines 106 are disposed at the cross points "C" between the doped lines 106 and the upper electrodes 116. When the doped lines 106 are formed of N-type impurity ions as described above, the doped regions 108' may be doped with P-type impurity ions, such as boron (B) ions. The doped regions 108' make P-N junctions with the doped lines 106, respectively. In other words, the doped regions 108' form a plurality of P-N junction diodes with the doped lines 106 at the cross points "C", respectively. In some embodiments of the present invention, the doped regions 108' may be doped layer patterns disposed at the cross points "C" on the doped lines 106, respectively. Hereinafter, reference numeral 108' will refer to the doped layer patterns. The doped layer patterns 108' may be polysilicon layer patterns doped with P-type impurity ions and/or single crystalline silicon layer patterns doped with P-type impurity ions. Lower electrodes 110' are disposed on the doped layer patterns 108', respectively. The lower electrodes 110' may be formed of a noble metal layer, a noble metal oxide layer, a tungsten layer, a titanium nitride layer and/or a polysilicon layer. In this case, the noble metal layer may be an iridium layer, a platinum layer and/or a ruthenium layer. Also, the noble metal oxide layer may be an iridium oxide layer and/or a ruthenium oxide layer.

The semiconductor substrate 100 having the doped layer patterns 108' and the lower electrodes 110' is covered with an insulating layer 112. In some embodiments, the insulating layer 112 fills spaces between the doped layer patterns 108' and between the lower electrodes 110', and exposes respective top surfaces of the lower electrodes 110'. The insulating layer 112 may be formed of a material having good gap filling characteristics, for example, silicon oxide, silicon nitride and/or silicon oxynitride.

A binary metal oxide layer 114 is disposed on the lower electrodes 110' and on the insulating layer 112. The binary metal oxide layer 114 is interposed between the lower electrodes 110' and the upper electrodes 116 as shown in FIGS. 6A and 6B and acts as a data storage material layer of the resistance RAM device. The binary metal oxide layer 114 can be expressed as a chemical formula of $M_xO_y$. In the formula, the characters "M", "O", "x", and "y" refer to metal, oxygen, a metal composition ratio, and an oxygen composition ratio, respectively. The metal "M" may be a transition metal and/or aluminum (Al). In this case, the transition metal may be nickel (Ni), niobium (Nb), titanium (Ti), zirconium (Zr), hafnium (Hf), cobalt (Co), iron (Fe), copper (Cu) and/or chrome (Cr). Specific examples of binary metal oxides that may be used as a data storage material layer include CuO, NiO, CoO, ZnO, $CrO_2$, $TiO_2$, $HfO_2$, $ZrO_2$, $Fe_2O_3$, and $Nb_2O_5$. As described above, a resistance RAM device according to exemplary embodiments of the present invention employs the binary metal oxide layer 114 as a data storage material layer. The binary metal oxide layer 114 has a reversible variation in resistance, which can be sensed at a voltage of less than 3 V. Also, the binary metal oxide layer 114 can be patterned by conventional photolithography and etching processes, which are used in the fabrication of semiconductor devices. Further, according to other embodiments of the present invention, the diodes, which include the doped layer patterns 108' and the doped lines 106, are disposed in contact with the lower electrodes 110' at the cross points "C", respectively. The diodes can serve to reduce or prevent a leakage current from flowing to other cells adjacent to a selected cell so that a switching current and a voltage are applied only to the selected cell. As a result, a resistance RAM device according to some embodiments of the invention can have little crosstalk between cells and can consume low power.

Hereinafter, methods of fabricating resistance RAM devices according to embodiments of the present invention will be described.

Figure 2A:
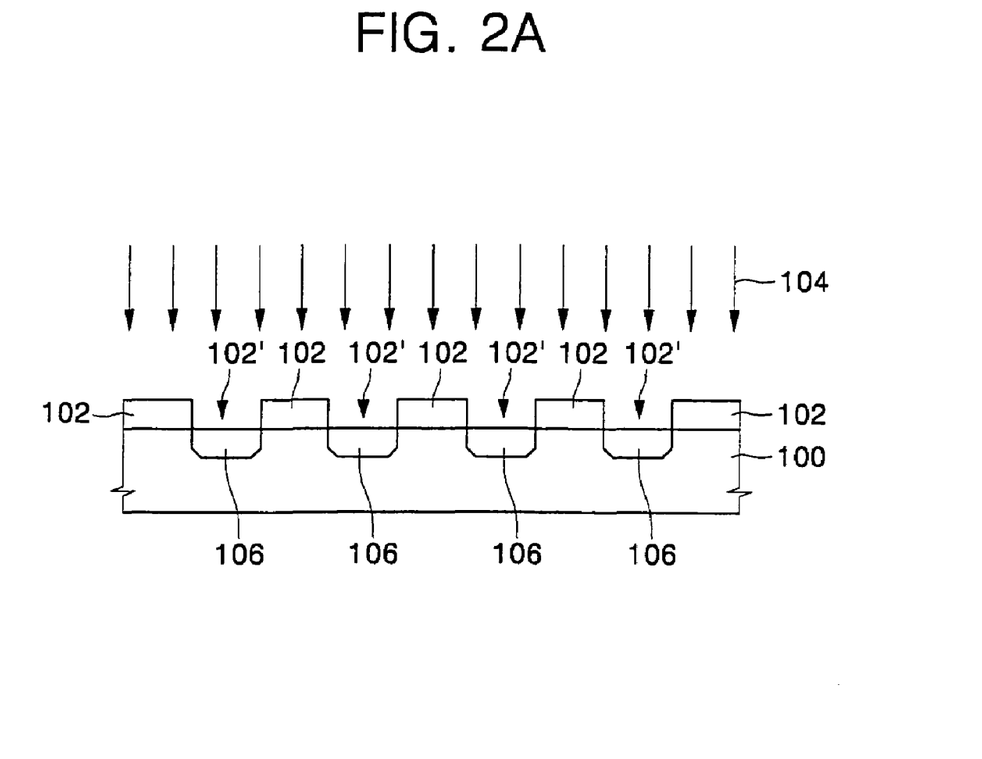
FIGS. 2A, 2B, 3A, 3B, 4A, 4B, 5A, 5B, 6A, and 6B are cross-sectional views illustrating methods of fabricating resistance RAM devices according to embodiments of the present invention.
Figure 2B:
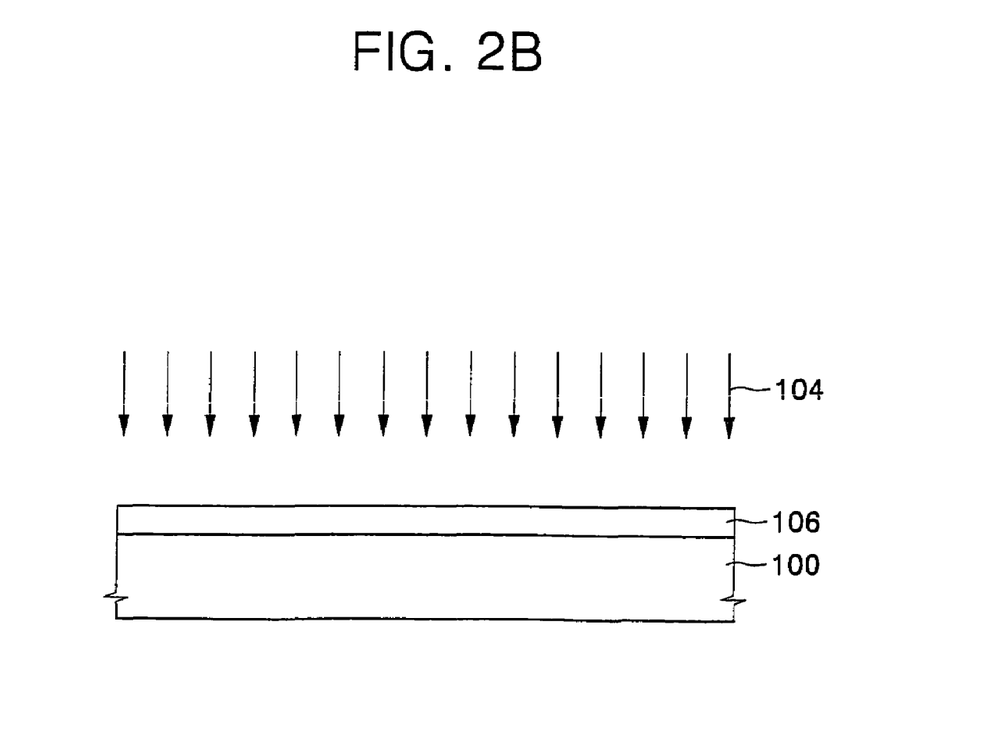

Referring to FIGS. 1, 2A, and 2B, a plurality of spaced apart, and in some embodiments, parallel, mask patterns 102 are formed on a semiconductor substrate 100. In some embodiments, each of the mask patterns 102 is formed in a line shape, and openings 102' are formed between the mask patterns 102 to expose partial surfaces of the semiconductor substrate 100. The mask patterns 102 may be, for example, silicon oxide layer patterns. In other words, the mask patterns 102 may be formed by depositing a silicon oxide layer on the semiconductor substrate 100 and patterning the silicon oxide layer using photolithography and etching processes. Next, impurity ions 104 are implanted into the semiconductor substrate 100 using the mask patterns 102 as ion implantation masks. Thus, a plurality of doped lines 106 are formed in the semiconductor substrate 100. The impurity ions 104 may be N-type impurity ions, such as As ions or P ions.

Figure 3A:
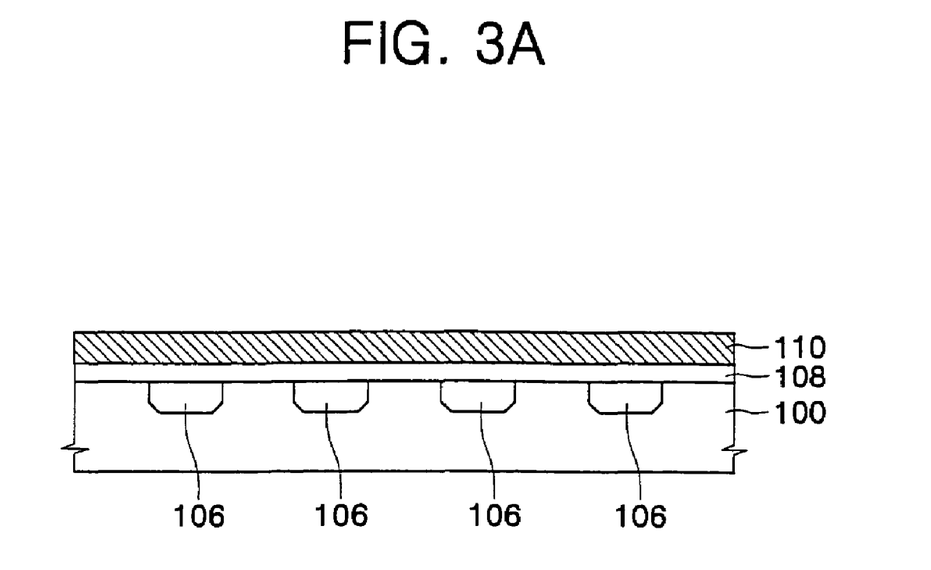
Figure 3B:
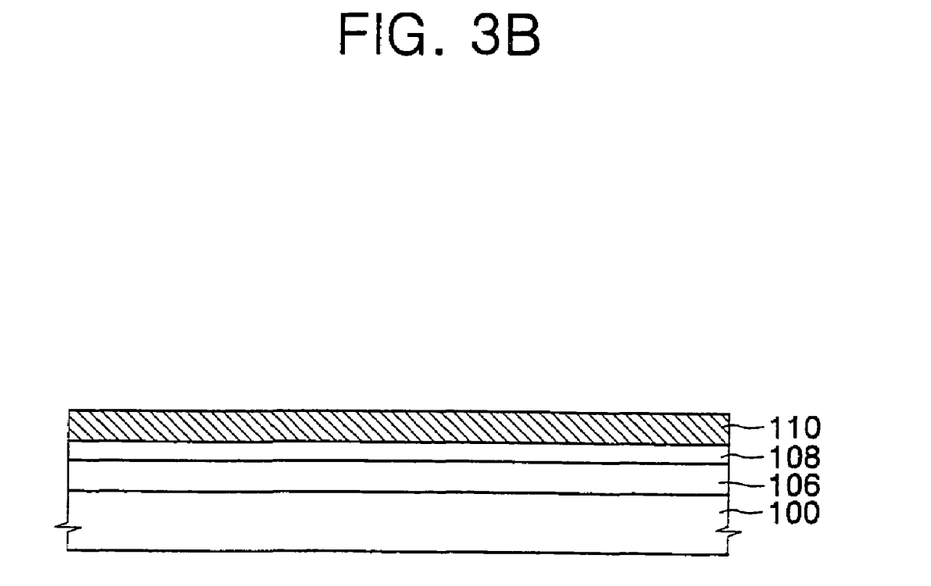

Referring to FIGS. 1, 3A, and 3B, the mask patterns 102 are removed. When the mask patterns 102 are formed of a silicon oxide layer, the mask patterns 102 may be removed by a wet etching process using an HF-containing etchant. Thereafter, a doped layer 108 and a lower conductive layer 110 are sequentially formed on the semiconductor substrate 100 having the doped lines 106. The doped layer 108 may be a polysilicon layer doped with P-type impurity ions (e.g., B ions) and/or a single crystalline silicon layer doped with P-type impurity ions. In forming a doped polysilicon layer as the doped layer 108, the P-type impurity ions may be doped in-situ during the formation of the polysilicon layer using a chemical vapor deposition (CVD) process. In other embodiments, the P-type impurity ions may be doped using a diffusion doping process and/or an ion implantation process after the polysilicon layer is formed. In forming a doped single crystalline silicon layer as the doped layer 108, the P-type impurity ions may be doped in-situ from an impurity source, such as a diborane ($B_2H_6$) source while a single crystalline silicon layer is being epitaxially grown on the semiconductor substrate 100 having the doped lines 106 using a CVD process. In other embodiments, the P-type impurity ions may be doped using a diffusion doping process and/or an ion implantation process after the single crystalline silicon layer is formed.

The lower conductive layer 110 may be formed of an oxidation resistant metal, since when the lower conductive layer 110 is oxidized during a subsequent annealing process, an interfacial characteristic between the lower conductive layer 110 and its adjacent material layer may deteriorate. The lower conductive layer 110 may be an iridium layer, a platinum layer, a ruthenium layer, an iridium oxide layer and/or a ruthenium oxide layer. In other embodiments, the lower conductive layer 110 may be a tungsten layer, a titanium nitride layer and/or a polysilicon layer.

Figure 4A:
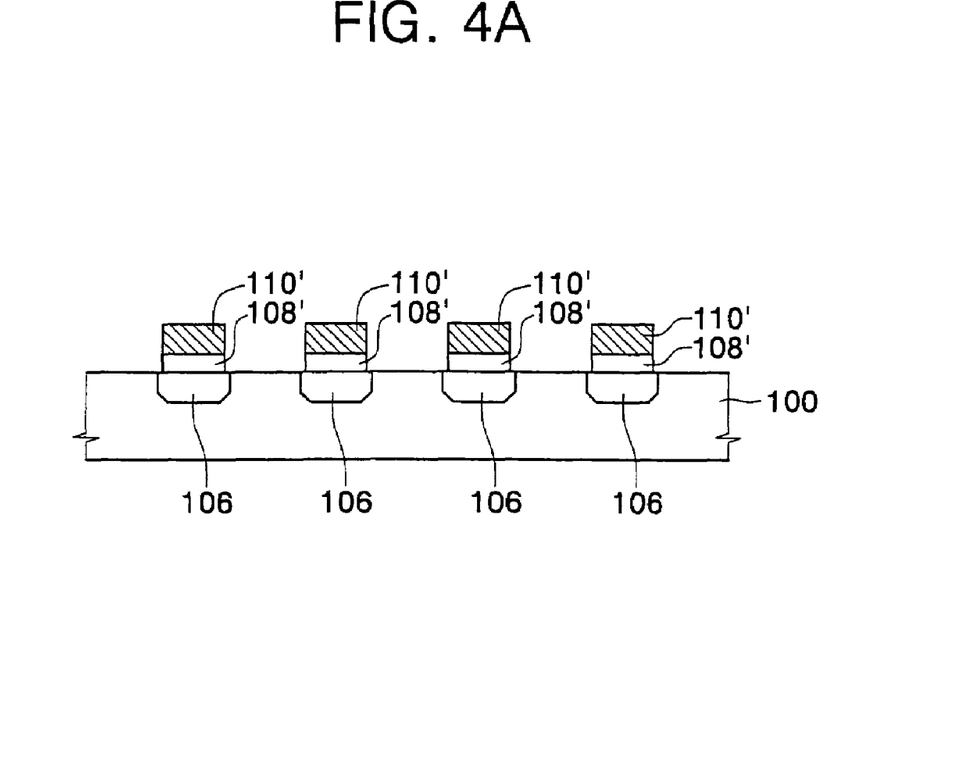
Figure 4B:
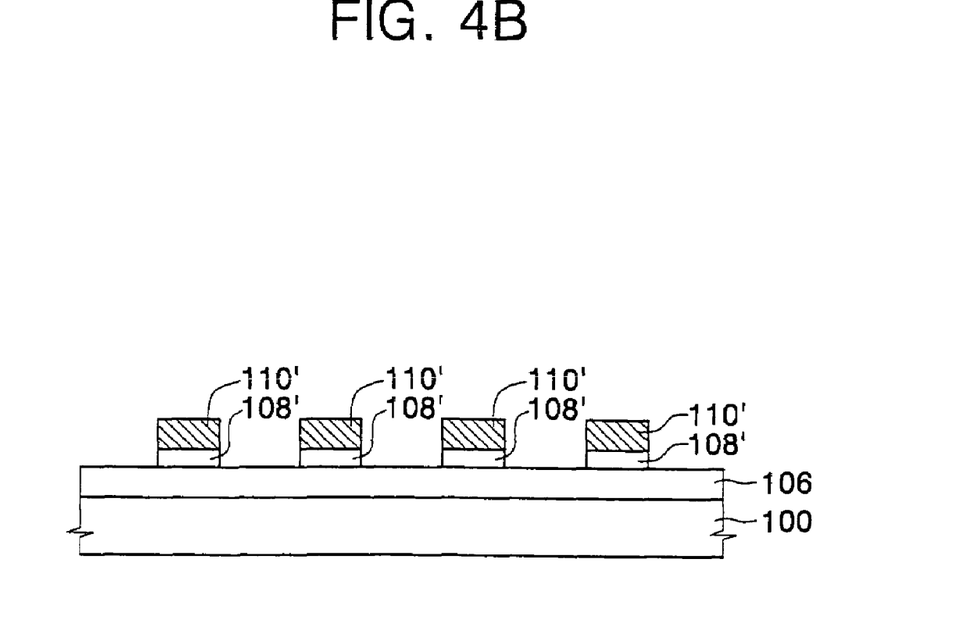

Referring to FIGS. 1, 4A, and 4B, the lower conductive layer 110 and the doped layer 108 are patterned, thereby forming doped layer patterns 108' and lower electrodes 110' that are sequentially stacked on the doped lines 106. When viewed from the plan view, the doped layer patterns 108' and the lower electrodes 110' may substantially have rectangular shapes, respectively, in some embodiments. The doped layer patterns 108' constitute diodes together with the doped lines 106, respectively.

Figure 5A:
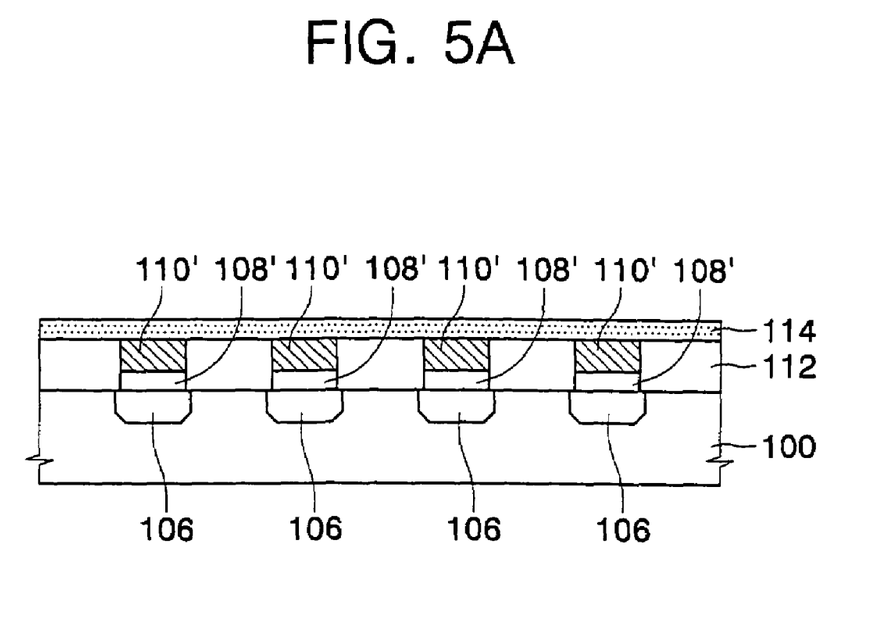
Figure 5B:
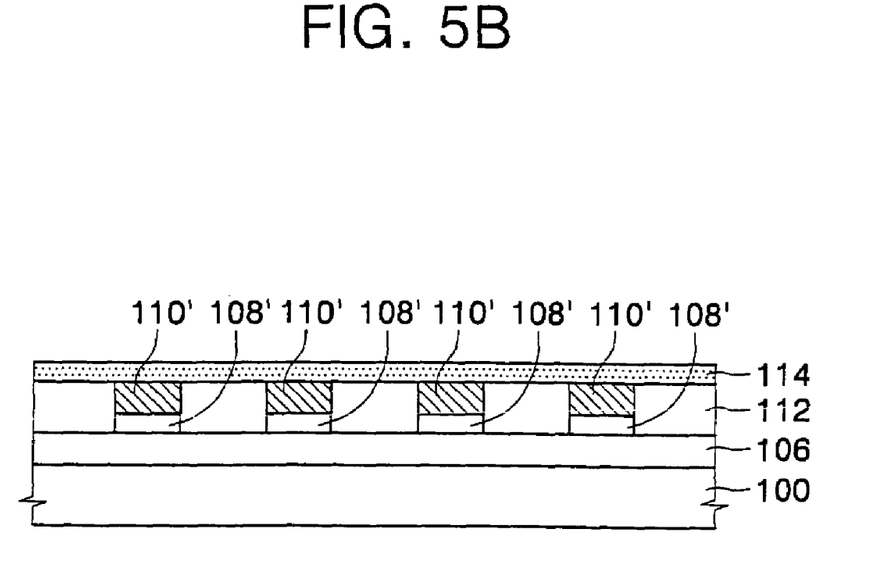

Referring to FIGS. 1, 5A, and 5B, an insulating layer 112 is formed to cover the doped layer patterns 108' and the lower electrodes 110'. Also, in some embodiments, the insulating layer 112 is formed to fill spaces between the doped layer patterns 108' and between the lower electrodes 110'. The insulating layer 112 may be formed of a material having good gap filling characteristics, for example, silicon oxide, silicon nitride and/or silicon oxynitride. Thereafter, the insulating layer 112 is planarized such that respective top surfaces of the lower electrodes 110' are exposed. The planarization of the insulating layer 112 may be performed using a chemical mechanical polishing (CMP) process. As described above, according to exemplary embodiments of the present invention, after the doped layer patterns 108' and the lower electrodes 110' are formed, they are subsequently covered with the insulating layer 112. As a result, since it is unnecessary to polish the lower electrodes 110' using a CMP process, even a noble metal may be used to form the lower electrodes 110'. Moreover, while the insulating layer 112 is being polished by the CMP process, the lower electrodes 110' can function as a polishing stop layer, thus an additional polishing stop layer may need not be provided.

Subsequently, a binary metal oxide layer 114 is formed to cover the insulating layer 112 and the top surfaces of the lower electrodes 110', which are exposed by the insulating layer 112. The binary metal oxide layer 114 can be expressed as a chemical formula of $M_xO_y$. In the formula, the characters "M", "O", "x", and "y" refer to metal, oxygen, a metal composition ratio, and an oxygen composition ratio, respectively. The metal "M" may be transition metal and/or aluminum (Al). In this case, the transition metal may be nickel (Ni), niobium (Nb), titanium (Ti), zirconium (Zr), hafnium (Hf), cobalt (Co), iron (Fe), copper (Co) and/or chrome (Cr). The binary metal oxide layer 114 may be made by forming the metal "M" layer on the insulating layer 112 and the lower electrodes 110' using a sputtering process and oxidizing the metal "M" layer using an $O_2$ plasma processing process. In this case, the $O_2$ plasma processing process may be performed in-situ. In another case, the binary metal oxide layer 114 may be formed by an $O_2$ reactive sputtering process, a CVD process and/or an atomic layer deposition (ALD) process. Specific examples of binary metal oxides that may be used as a data storage material layer include CuO, NiO, CoO, ZnO, $CrO_2$, $TiO_2$, $HfO_2$, $ZrO_2$, $Fe_2O_3$, and $Nb_2O_5$.

Referring to FIGS. 1, 6A, and 6B, a plurality of spaced apart, and in some embodiments, parallel, upper electrodes 116 are formed on the binary metal oxide layer 114 such that the upper electrodes overlap the lower electrodes 114 and cross over the doped lines 106. To form the upper electrodes 116, an upper conductive layer (not shown) may be formed on the binary metal oxide layer 114 and then patterned. The upper electrodes 116 cross over the doped lines 106 so that cross points "C" are formed in respective regions where the upper electrodes 116 overlap the doped lines 106. The doped layer patterns 108' and the lower electrodes 110' are disposed at the cross points "C", respectively. Like the lower electrodes 110', the upper electrodes 116 may be formed of an iridium layer, a platinum layer, a ruthenium layer, an iridium oxide layer and/or a ruthenium oxide layer. In another case, the upper electrodes 116 may be formed of a tungsten layer, a titanium nitride layer and/or a polysilicon layer. Portions of the binary metal oxide layer 114, which are interposed between the upper electrodes 116 and the lower electrodes 110', are provided as data storage material layers of the resistance RAM device.

As described above, embodiments of the present invention can provide cross-point nonvolatile memory devices using a binary metal oxide layer as a data storage material layer. According to exemplary embodiments of the present invention, highly integrated resistance RAM devices, which can stably operate at low voltage, may be provided.

Also, diodes are formed in respective cells of the resistance RAM devices, which can reduce crosstalk between adjacent cells caused by a leakage current and can also reduce power consumption.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A nonvolatile memory device comprising:
   a plurality of spaced apart doped lines disposed in a substrate;
   a plurality of spaced apart upper electrodes crossing over the doped lines such that cross points are formed where the upper electrodes overlap the doped lines;
   a plurality of lower electrodes, a respective one of which is disposed at a respective cross point between the doped lines and the upper electrodes;
   a binary metal oxide data storage material layer between the upper electrodes and the lower electrodes;
   doped layer patterns between the lower electrodes and the doped lines and forming diodes together with the doped lines, the doped layer patterns having an opposite conductivity to the doped lines, wherein the doped layer patterns are disposed at the cross points on the doped lines, respectively; and
   an insulating layer in spaces between the binary metal oxide layer and the substrate, wherein the insulating layer surrounds sides of the doped layer patterns and sides of the lower electrodes,
   wherein the binary metal oxide data storage material layer comprises a binary metal oxide consisting of a compound having the chemical formula of $M_xO_y$, wherein the characters "M", "O", "x", and "y" refer to a metal, oxygen, a metal composition ratio, and an oxygen composition ratio, respectively, and the metal "M" is a transition metal or aluminum.

2. The device according to claim 1, wherein the transition metal is selected from the group consisting of nickel, niobium, titanium, zirconium, hafnium, cobalt, iron, copper and chrome.

3. The device according to claim 1, wherein the doped lines are N-type lines, and the doped layer patterns are P-type patterns.

4. The device according to claim 1, wherein the doped layer patterns are doped polysilicon layer patterns or doped single crystalline silicon layer patterns.

5. The device according to claim 1, wherein the lower electrodes are selected from the group consisting of an iridium layer, a platinum layer, a ruthenium layer, an iridium oxide layer, a ruthenium oxide layer, a tungsten layer, a titanium nitride layer and a polysilicon layer.

6. The device according to claim 1, wherein the upper electrodes are selected from the group consisting of an iridium layer, a platinum layer, a ruthenium layer, an iridium oxide layer, a ruthenium oxide layer, a tungsten layer, a titanium nitride layer and a polysilicon layer.

7. The device according to claim 1, wherein the insulating layer comprises a silicon oxide layer, a silicon nitride layer or a silicon oxynitride layer.

8. A method of fabricating a nonvolatile memory device, comprising:

forming a plurality of spaced apart doped lines in a substrate;

forming a plurality of doped layer patterns and a plurality of lower electrodes on the doped layer patterns, the doped layer patterns being in contact with the doped lines and having an opposite conductivity to the doped lines;

forming an insulating layer on the substrate including on the doped layer patterns and on the lower electrodes;

planarizing the insulating layer to expose the lower electrodes such that the planarized insulating layer surrounds sides of the doped layer patterns and sides of the lower electrodes;

forming a binary metal oxide layer on the lower electrodes, wherein the binary metal oxide layer is formed on the lower electrodes and on the planarized insulating layer; and forming a plurality of spaced apart upper electrodes on the binary metal oxide layer such that the upper electrodes overlap the lower electrodes and intersect the doped lines, wherein the binary metal oxide layer comprises a binary metal oxide consisting of a compound having the chemical formula of $M_xO_y$, wherein the characters "M", "O", "x", and "y" refer to a metal, oxygen, a metal composition ratio, and an oxygen composition ratio, respectively, and the metal "M" is a transition metal or aluminum.

9. The method according to claim 8, wherein forming the doped lines comprises:

forming mask patterns having line-shaped openings on the substrate; and implanting impurity ions into the semiconductor substrate using the mask patterns as ion implantation masks.

10. The method according to claim 9, wherein the impurity ions are N-type impurity ions.

11. The method according to claim 8, wherein forming the doped layer patterns and the lower electrodes comprises:

forming a doped layer on the substrate having the doped lines, the doped layer having an opposite conductivity to the doped lines;

forming a lower conductive layer on the doped layer; and sequentially patterning the lower conductive layer and the doped layer.

12. The method according to claim 11, wherein when the doped lines comprise N-type impurity ions, the doped layer comprises P-type impurity ions.

13. The method according to claim 11, wherein the doped layer comprises a doped polysilicon layer or a doped single crystalline silicon layer.

14. The method according to claim 8, wherein the lower electrodes are selected from the group consisting of iridium layer, a platinum layer, a ruthenium layer, an iridium oxide layer, a ruthenium oxide layer, a tungsten layer, a titanium nitride layer and a polysilicon layer.

15. The method according to claim 8, wherein the transition metal is selected from the group consisting of nickel, niobium, titanium, zirconium, hafnium, cobalt, iron, copper and chrome.

16. The method according to claim 8, wherein the upper electrodes are selected from the group consisting of iridium layer, a platinum layer, a ruthenium layer, an iridium oxide layer, a ruthenium oxide layer, a tungsten layer, a titanium nitride layer and a polysilicon layer.

17. A nonvolatile memory device comprising:

a plurality of first spaced apart lines;

a plurality of second spaced apart lines that cross over the plurality of first spaced apart lines to define a plurality of cross points therebetween; and a diode and a binary metal oxide nonvolatile data storage medium serially connected between the first and second spaced apart lines at the respective cross points, wherein the binary metal oxide nonvolatile data storage medium comprises a binary metal oxide consisting of a compound having the chemical formula of $M_xO_y$, wherein the characters "M", "O", "x", and "y" refer to a metal, oxygen, a metal composition ratio, and an oxygen composition ratio, respectively, and the metal "M" is a transition metal or aluminum.

18. The device according to claim 17 wherein the plurality of spaced apart lines comprise a plurality of doped regions of a first conductivity type in a substrate and wherein the diode comprises a doped region of a second conductivity type on the doped regions of the first conductivity type.

19. The device according to claim 18 further comprising an electrode between a respective diode and the binary metal oxide.

* * * * *